United States Patent
Harada et al.

(10) Patent No.: US 11,631,801 B2
(45) Date of Patent: Apr. 18, 2023

(54) MULTILAYER PIEZOELECTRIC CERAMIC AND METHOD FOR MANUFACTURING SAME, MULTILAYER PIEZOELECTRIC ELEMENT, AS WELL AS PIEZOELECTRIC VIBRATION DEVICE

(71) Applicant: TAIYO YUDEN CO., LTD., Tokyo (JP)

(72) Inventors: Tomohiro Harada, Takasaki (JP); Takayuki Goto, Takasaki (JP); Ryo Ito, Takasaki (JP); Hiroyuki Shimizu, Takasaki (JP); Sumiaki Kishimoto, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 378 days.

(21) Appl. No.: 16/833,251

(22) Filed: Mar. 27, 2020

(65) Prior Publication Data

US 2020/0313071 A1 Oct. 1, 2020

(30) Foreign Application Priority Data

Mar. 29, 2019 (JP) .............................. JP2019-066822
Mar. 24, 2020 (JP) .............................. JP2020-052705

(51) Int. Cl.
*H01L 41/187* (2006.01)
*H01L 41/277* (2013.01)
(Continued)

(52) U.S. Cl.
CPC ........ *H01L 41/1871* (2013.01); *H01L 41/047* (2013.01); *H01L 41/083* (2013.01); *H01L 41/277* (2013.01)

(58) Field of Classification Search
CPC . H01L 41/1871; H01L 41/047; H01L 41/083; H01L 41/277; H01L 41/0474;
(Continued)

(56) References Cited

U.S. PATENT DOCUMENTS

2003/0202672 A1* 10/2003 Yamauchi ............ H04R 31/003
381/190
2008/0290316 A1 11/2008 Katayama et al.
(Continued)

FOREIGN PATENT DOCUMENTS

| JP | 2010180121 A | 8/2010 |
|---|---|---|
| JP | 2017163055 A | 9/2017 |
| WO | 2007094115 A1 | 8/2007 |

OTHER PUBLICATIONS

A First Office Action issued by the State Intellectual Property Office of China dated Jul. 5, 2022, for Chinese counterpart application No. 202010227187.4 (6 pages).

*Primary Examiner* — Shahed Ahmed
(74) *Attorney, Agent, or Firm* — Law Office of Katsuhiro Arai

(57) ABSTRACT

A multilayer piezoelectric ceramic is constituted by: piezoelectric ceramic layers which do not contain lead as a constituent element, have a perovskite compound expressed by the composition formula $Li_xNa_yK_{1-x-y}NbO_3$ (where $0.02<x\le0.1$, $0.02<x+y\le1$) as the primary component, and contain 0.2 to 3.0 mol of Li relative to 100 mol of the primary component; and internal electrode layers which are constituted by a metal that contains silver by 80 percent by mass or more; wherein the multilayer piezoelectric ceramic is such that Li compounds other than the primary component are localized therein. The multilayer piezoelectric element can offer excellent insulating property.

9 Claims, 5 Drawing Sheets

(51) Int. Cl.
  *H01L 41/083*  (2006.01)
  *H01L 41/047*  (2006.01)

(58) Field of Classification Search
  CPC .............. H01L 41/273; H01L 41/1873; H01L 41/00–0536; H01L 41/08–1138; C04B 35/495; C04B 35/622; C04B 41/009; C04B 41/5116; C04B 41/88; B32B 9/005; B32B 9/04; B32B 2307/20; B32B 2457/00
  See application file for complete search history.

(56) References Cited

U.S. PATENT DOCUMENTS

| | | | |
|---|---|---|---|
| 2016/0204335 A1* | 7/2016 | Oshima | H01L 41/0477 310/314 |
| 2017/0263845 A1* | 9/2017 | Hatano | H01L 41/273 |
| 2019/0189346 A1* | 6/2019 | Koga | C04B 35/4682 |

* cited by examiner

MULTILAYER PIEZOELECTRIC CERAMIC AND METHOD FOR MANUFACTURING SAME, MULTILAYER PIEZOELECTRIC ELEMENT, AS WELL AS PIEZOELECTRIC VIBRATION DEVICE

CROSS-REFERENCE TO RELATED APPLICATIONS

The present application claims priority to Japanese Patent Application No. 2019-066822, filed Mar. 29, 2019, and No. 2020-052705, filed Mar. 24, 2020, each disclosure of which is incorporated herein by reference in its entirety including any and all particular combinations of the features disclosed therein.

BACKGROUND

Field of the Invention

The present invention relates to a multilayer piezoelectric ceramic and a method for manufacturing the same, a multilayer piezoelectric element, as well as a piezoelectric vibration device.

Description of the Related Art

Piezoelectric ceramics are widely used for sensors, actuators, etc., that utilize the properties of piezoelectric elements formed therefrom to undergo mechanical displacement and consequently generate electrical charge, or to produce mechanical displacement based on potential differences between electrodes.

For the compositions of piezoelectric ceramics that constitute piezoelectric elements, lead zirconate titanate ($Pb(Zr, Ti)O_3$, PZT) and solid solutions thereof are widely used. PZT-based piezoelectric ceramics have advantages in that their high Curie temperatures make them usable in high-temperature environments, while their high electromechanical coupling coefficients permit efficient conversion of electrical energy to mechanical energy and vice versa. Also, these piezoelectric ceramics can be sintered at temperatures below 1000° C. when appropriate compositions are selected, which is another advantage because the manufacturing costs of piezoelectric elements can be reduced. Particularly with regard to multilayer piezoelectric ceramics, significant cost reduction effects can be achieved because low-melting-point materials containing fewer quantities of expensive materials such as platinum and palladium can be used for the internal electrodes that are sintered simultaneously with the piezoelectric ceramic. However, PZT-based piezoelectric ceramics are considered problematic in that they contain lead, which is a harmful substance, and accordingly there is a need for alternative, lead-free piezoelectric ceramics.

To date, various lead-free piezoelectric compositions have been reported, such as those based on alkali niobates ($(Li, Na,K)NbO_3$), sodium bismuth titanate ($(Bi_{0.5}Na_{0.5})TiO_3$, BNT), bismuth layered compounds, and tungsten bronze, to name a few. Among these, alkali niobate-based piezoelectric ceramics are drawing attention as the piezoelectric ceramics to replace PZT-based ones, owing to their high Curie temperatures and relatively high electromechanical coupling coefficients (Patent Literature 1).

With any alkali niobate-based piezoelectric ceramic, use of silver-containing internal electrodes may cause this silver to diffuse into the piezoelectric ceramic in the process of stacking piezoelectric ceramic layers alternately with the internal electrodes to form a multilayer piezoelectric ceramic, and cause the electrical resistance to drop, thereby impairing the reliability of the piezoelectric element. In contrast, Patent Literature 2 reports having achieved a high electrical resistivity with an alkali niobate-based piezoelectric ceramic composition containing an alkali earth metal and silver, even when internal electrodes of $Ag_{0.7}Pd_{0.3}$ were used.

Background Art Literatures

[Patent Literature 1] International Patent Laid-open No. 2007/094115

[Patent Literature 2] Japanese Patent Laid-open No. 2017-163055

SUMMARY

In recent years, a growing call for reducing the costs of multilayer piezoelectric elements is necessitating the use, as internal electrodes, of an 80/20 Ag—Pd alloy using a reduced quantity of expensive Pd, as well as alloys with even higher content percentages of silver, including pure silver.

Still, these multilayer piezoelectric elements having internal electrodes with high content percentages of silver are subject to low insulating property, even when the countermeasures described in Patent Literature 2 are taken.

Accordingly, an object of the present invention is to provide a multilayer piezoelectric element having excellent insulating property, whose piezoelectric ceramic layers do not contain lead as a constituent element, and whose internal electrode layers have a high content percentage of silver.

After conducting various studies to solve the aforementioned problems, the inventor of the present invention found that the problems could be solved by increasing the sintering period when manufacturing a multilayer piezoelectric ceramic whose primary component is an alkali niobate, in order to allow a lithium compound other than the primary component to localize in a given portion in the multilayer piezoelectric ceramic, and eventually completed the present invention.

To be specific, the first aspect of the present invention to solve the aforementioned problems is a multilayer piezoelectric ceramic constituted by alternately stacked piezoelectric ceramic layers and internal electrode layers, wherein such multilayer piezoelectric ceramic is characterized in that: the piezoelectric ceramic layers: do not contain lead as a constituent element; have a perovskite compound expressed by the composition formula $Li_xNa_yK_{1-x-y}NbO_3$ (where $0.02<x\leq0.1$, $0.02<x+y\leq1$) as the primary component; and contain 0.2 to 3.0 mol of Li relative to 100 mol of the primary component; the internal electrode layers are constituted by a metal that contains silver by 80 percent by mass or more; and Li compounds other than the primary component are localized in a given portion within the multilayer piezoelectric ceramic (the phrase "localized in a given portion within the multilayer piezoelectric ceramic" may simply be referred to as "localized within the multilayer piezoelectric ceramic").

Also, the second aspect of the present invention is a method for manufacturing multilayer piezoelectric ceramic constituted by alternately stacked piezoelectric ceramic layers and internal electrode layers, wherein such method for manufacturing multilayer piezoelectric ceramic includes: preparing green sheets which contain: a material powder that has a perovskite compound expressed by the composition formula $Li_xNa_yK_{1-x-y}NbO_3$ (where $0.02<x\leq0.1$, $0.02<x+y\leq1$) as the primary component; 0.2 to 3.0 mol of Li relative to 100 mol of the primary component; and do not contain lead as a constituent element; and a binder; preparing a conductive paste containing a metal powder whose silver content is 80 percent by mass or higher; forming conductor layers on the green sheets using the conductive paste; stacking the green sheets on which the conductor layers have been formed and then bonding the green sheets together to obtain a formed green sheet; and removing the binder from the formed green sheet and then sintering it for 5 hours or longer at a temperature of 850° C. or above to obtain a sintered body.

Furthermore, the third aspect of the present invention is a multilayer piezoelectric element containing the aforementioned multilayer piezoelectric ceramic, while the fourth aspect of the present invention is a piezoelectric vibration device containing the piezoelectric element and a vibration plate joined thereto.

According to the present invention, a multilayer piezoelectric element having excellent insulating property, whose piezoelectric ceramic layers do not contain lead as a constituent element, and whose internal electrode layers have a high content percentage of silver, can be provided.

DESCRIPTION OF THE SYMBOLS

Figure 1A:
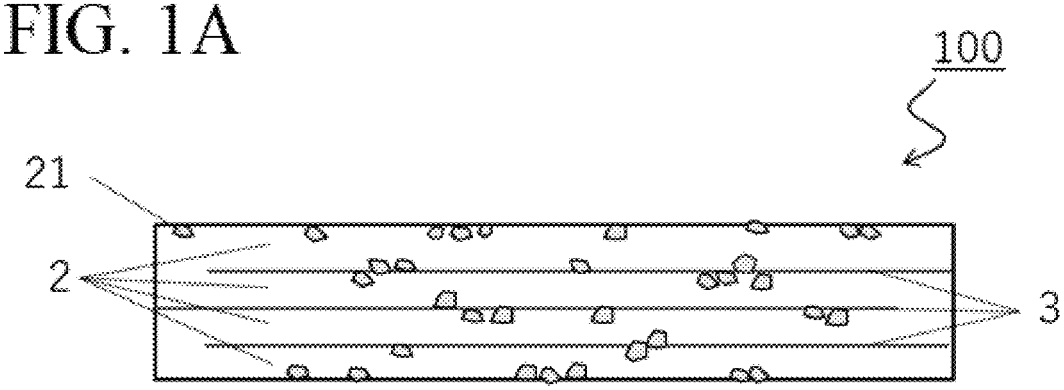
FIGS. 1A and 1B are schematic views showing the structure of a multilayer piezoelectric ceramic (FIG. 1A is a front view, while FIG. 1B is a perspective view)

100 Multilayer piezoelectric ceramic
110 Multilayer piezoelectric element
2 Piezoelectric ceramic layer
21 Li compound other than the primary component
3 Internal electrode layer
41, 42 Connection conductor
51, 52 Surface electrode

DETAILED DESCRIPTION OF EMBODIMENTS

The constitutions as well as functions and effects of the present invention are explained below, together with the technical ideas, by referring to the drawings. It should be noted, however, that the mechanisms of functions include estimations and whether they are right or wrong does not limit the present invention in any way. Also, of the constituent components recited in any embodiments disclosed herein and associated with any aspects disclosed below, those constituent components not described in a manner representing the most generic scope/concepts are explained as optional constituent components which can constitute any embodiments representing more specific scope/concepts than the most generic scope/concepts in any one or more respects. It should be noted that a description of numerical range (description of two values connected by "to") is interpreted to include the described values as the lower limit and the upper limit.

[Multilayer Piezoelectric Ceramic]

Figure 1B:
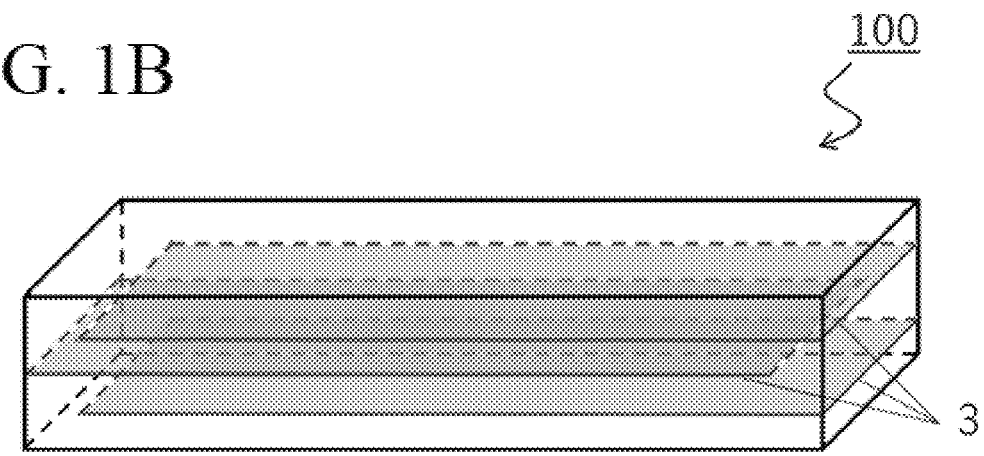

As shown schematically in FIGS. 1A and 1B, the multilayer piezoelectric ceramic 100 pertaining to the first aspect of the present invention (hereinafter also referred to simply as "first aspect") is constituted by piezoelectric ceramic layers 2 stacked alternately with internal electrode layers 3. It should be noted that, while the structure shown in the figures has the internal electrode layers 3 exposed on multiple end faces of the multilayer piezoelectric ceramic 100 for easy identification of the positions of the internal electrode layers 3, the structure of the first aspect is not limited thereto and it may be a structure where the internal electrode layers 3 are exposed only on one end face of the multilayer piezoelectric ceramic 100, or a structure where the internal electrode layers 3 are not exposed on any end face of the multilayer piezoelectric ceramic 100.

Additionally, the piezoelectric ceramic layers 2 do not contain lead as a constituent element, have a perovskite compound expressed by the composition formula $Li_xNa_yK_{1-x-y}NbO_3$ (where $0.02<x\leq0.1$, $0.02<x+y\leq1$) as the primary component, and contain 0.2 to 3.0 mol of Li relative to 100 mol of the primary component. Also, the internal electrode layers 3 are constituted by a metal that contains silver by 80 percent by mass or more. Furthermore, Li compounds 21 other than the primary component are localized within the piezoelectric ceramic 100.

Since the piezoelectric ceramic layers 2 in the first aspect do not contain lead as a constituent element, environmental burdens can be reduced. In this Specification, "do not contain lead as a constituent element" means lead is not contained except for lead that is unavoidably contained in the material or lead that unavoidably mixes in during the manufacturing process to the extent that lead does not materially change the characteristics of the resultant piezoelectric ceramic for its intended use or application. Likewise, in this disclosure, " . . . does not contain an element M as a constituent element" means that M is not contained except for M that is unavoidably contained in the material or M that unavoidably mixes in during the manufacturing process to the extent that M does not materially change the characteristics of the resultant piezoelectric ceramic for its intended use or application. Further, in this disclosure, in some embodiments, any one or more of the disclosed elements or components as options can be exclusively selected or can expressly be excluded, depending on the target piezoelectric ceramic to be manufactured, its target properties, etc., and/or for practical reasons, operational reasons, etc.

The piezoelectric ceramic layers 2 in the first aspect have a perovskite compound expressed by the composition formula $Li_xNa_yK_{1-x-y}NbO_3$ (where $0.02<x\leq0.1$, $0.02<x+y\leq1$) as the primary component. Here, the "primary component" in this disclosure refers to the component contained in the largest quantity, based on mass, in the piezoelectric ceramic layers 2. In some embodiments, it further refers to a piezoelectric ceramic wherein the above perovskite structure is substantially maintained as if it contains no other indispensable constituent element(s).

In the aforementioned composition formula, the value of x, or specifically the content percentage of Li, shall be greater than 0.02 but no greater than 0.1. Adjusting the value of x to greater than 0.02 will make the piezoelectric ceramic dense. The value of x is adjusted preferably to 0.04 or greater, or more preferably to 0.06 or greater. On the other hand, adjusting the value of x to no greater than 0.1 will inhibit the production of $Li_3NbO_4$ and other conductive compounds, so that the piezoelectric ceramic will have excellent insulating property and durability. The value of x is adjusted preferably to no greater than 0.09, or more preferably to no greater than 0.08.

The value of x+y in the composition formula, or specifically the total sum of the content percentage of Li and the content percentage of Na being an optional component, shall be greater than 0.02 but no greater than 1. By ensuring that the values of x and y satisfy this condition, the piezoelectric ceramic will have excellent piezoelectric properties.

The piezoelectric ceramic layers 2 in the first aspect may contain other additive elements or compounds to the extent that desired properties are achieved, so long as their primary component is a perovskite compound expressed by the aforementioned composition formula. Examples of additive elements that can be contained include, in addition to Ta and Sb that are commonly used, Sc, Ti, V, Cr, Fe, Co, Ni, Cu, Zn, Y, Mo, La, Ce, Pr, Nd, Sm, Eu, Gd, Tb, Dy, Ho, Er, Tm, Yb, Lu, Hf, W, and the like.

Here, the following method is used to confirm that the piezoelectric ceramic layers 2 have a perovskite compound expressed by the aforementioned composition formula as their primary component.

First, an X-ray diffraction system based on Cu-Kα rays (RINT2500 Series, manufactured by Rigaku Corporation) is used to measure the diffraction line profiles of the piezoelectric ceramic layer 2 exposed at the topmost surface of the multilayer piezoelectric ceramic 100 in the laminating direction, and if a profile derived from the perovskite structure is recognized as the primary component, and also if the ratios of the strongest diffraction line intensities in the diffraction profiles that are assumed to have been derived from other structures, to the strongest diffraction line intensity in the profile derived from the perovskite structure, are 10 percent or lower, then such multilayer piezoelectric ceramic is determined to have a perovskite compound as the primary component. It should be noted that, if an electrode is formed on the topmost surface of the multilayer piezoelectric ceramic and the piezoelectric ceramic layer is not exposed, the electrode is removed by means of polishing, etc., prior to measurement.

Next, to add conductivity, carbon is vapor-deposited on the piezoelectric ceramic layers 2 of the multilayer piezoelectric ceramic 100 whose primary component has been determined as a perovskite compound, after which energy dispersive X-ray spectroscopic (EDS) measurement is performed using a silicon-drift energy dispersive X-ray detector (Apollo, manufactured by AMETEK, Inc.) installed on a field-emission scanning electron microscope (FE-SEM) (S-4300, manufactured by Hitachi High-Technologies Corporation). The measurement voltage is set to 10 kV, and K—K, Na—K and Nb-L spectra are used for quantitative evaluation. Measurement is performed over a sufficient period of time so that the K—K spectral line intensity reaches a count of 5000 or higher. Atomic-number correction, absorption correction, and fluorescence correction (ZAF corrections) are performed on the respective spectra, to calculate the content of each element.

Lastly, a composition formula is determined by using, as the values of y and 1–x–y in the aforementioned composition formula, the content ratios of Na and K to the calculated Nb content (in percent by mol or percent by atom), respectively, and those piezoelectric ceramic layers 2 whose composition formula as determined herein falls within the ranges of the aforementioned composition formula are considered to have a perovskite compound expressed by the aforementioned composition formula as the primary component.

The piezoelectric ceramic layers 2 in the first aspect contain 0.2 to 3.0 mol of Li relative to 100 mol of the aforementioned primary component.

When Li is contained by 0.2 mol or higher relative to 100 mol of the primary component, the piezoelectric ceramic will become dense. This function will become more prominent when Si, as mentioned later, is also used. Additionally, when Li is contained, the piezoelectric properties are expected to improve. The content of Li is adjusted preferably to 0.3 mol or higher, or more preferably to 0.5 mol or higher, relative to 100 mol of the aforementioned primary component.

On the other hand, adjusting the content of Li relative to 100 mol of the primary component to 3.0 mol or lower will inhibit the production of $Li_3NbO_4$ and other conductive compounds, and the piezoelectric ceramic will have excellent insulating property and durability. The content of Li is adjusted preferably to 2.0 mol or lower, or more preferably to 1.5 mol or lower.

Also, the piezoelectric ceramic layers 2 in the first aspect may contain 0.2 to 5.0 mol of at least one type of alkali earth metal element selected from the group that includes Ca, Sr, and Ba, relative to 100 mol of the aforementioned primary component.

When the content of these alkali earth metal elements relative to 100 mol of the primary component is adjusted to 0.2 mol or higher, the piezoelectric ceramic will have excellent piezoelectric properties, and it will also have excellent insulation resistance due to production of fine polycrystals. The content of alkali earth metal elements is adjusted preferably to 0.4 mol or higher, or more preferably to 0.5 mol or higher.

On the other hand, adjusting the content of alkali earth metal elements relative to 100 mol of the primary component to 5.0 mol or lower will allow for retention of high piezoelectric performance. The content of alkali earth metal elements is adjusted preferably to 4.0 mol or lower, or more preferably to 3.0 mol or lower.

Also, the piezoelectric ceramic layers 2 in the first aspect may contain 0.2 to 2.0 mol of Mn relative to 100 mol of the aforementioned primary component.

Adjusting the content of Mn relative to 100 mol of the primary component to 0.2 mol or higher will improve the electrical resistance of the piezoelectric ceramic layers. The content of Mn is adjusted preferably to 0.3 mol or higher, or more preferably to 0.5 mol or higher.

On the other hand, adjusting the content of Mn relative to 100 mol of the primary component to 2.0 mol or lower will allow for retention of high piezoelectric performance. The content of Mn is adjusted preferably to 1.5 mol or lower, or more preferably to 1.0 mol or lower.

Furthermore, the piezoelectric ceramic layers 2 in the first aspect may contain 0.1 to 3.0 mol of Si relative to 100 mol of the aforementioned primary component.

Adjusting the content of Si relative to 100 mol of the primary component to 0.1 mol or higher will make the piezoelectric ceramic dense. This function will become more prominent when Li, as mentioned above, is also used.

Another function of Si is to react with excessive Li to produce $Li_2SiO_3$, $Li_4SiO_4$ and other compounds, thereby inhibiting the production of $Li_3NbO_4$ and other conductive compounds. The content of Si is adjusted preferably to 0.5 mol or higher, or more preferably to 1.0 mol or higher.

On the other hand, adjusting the content of Si relative to 100 mol of the primary component to 3.0 mol or lower will suppress the production quantity of heterogeneous phases with no piezoelectricity, and the piezoelectric ceramic will have excellent piezoelectric properties. The content of Si is adjusted preferably to 2.5 mol or lower, or more preferably to 2.0 mol or lower.

Here, the contents of the respective elements relative to the primary component are obtained by measuring the contents of Nb and the respective elements using a high-frequency inductively coupled plasma atomic emission spectrometer (ICP-AES) (iCAP6500, manufactured by Thermo Fisher Scientific K.K.), ion chromatographic system (ICS-1600, manufactured by Thermo Fischer Scientific K.K.), or X-ray fluorescence analyzer (XRF) (ZSX Primus-IV, manufactured by Rigaku Corporation), and then calculating the mol numbers of the respective elements relative to the content of Nb representing 100 mol, based on the content ratios of the respective elements to Nb.

The internal electrode layers 3 in the first aspect are constituted by a metal that contains silver by 80 percent by mass or more. By increasing the content of silver, the use quantities of palladium (Pd), platinum (Pt), and other expensive materials can be kept low and the material cost can be reduced. Also, the conductivity of the internal electrode layers can be increased. The metal used for the electrode material may be an Ag—Pd alloy, pure silver, etc. The content of silver in the aforementioned metal is adjusted preferably to 85 percent by mass or higher, or more preferably to 90 percent by mass or higher.

In the first aspect, Li compounds 21 other than the aforementioned primary component are localized within the multilayer piezoelectric ceramic 100. This way, the insulating property of the piezoelectric ceramic layers 2 will be retained and a multilayer piezoelectric element 110 having excellent insulating property can be obtained.

The mechanism behind why the insulating property of the piezoelectric ceramic layers 2 is retained by the fact that Li compounds 21 other than the aforementioned primary component are localized, is considered as follows. When the multilayer piezoelectric ceramic 100 is manufactured, a lithium compound that has been added to the aforementioned primary component produces $Li_3NbO_4$ and other conductive compounds during sintering. If these conductive Li compounds are evenly distributed throughout the multilayer piezoelectric ceramic 100, the resistivity of the piezoelectric ceramic layers 2, which should normally have electrical insulating property, will drop as a whole. If, on the other hand, Li compounds 21 other than the aforementioned primary component are localized within the multilayer piezoelectric ceramic 100, as is the case of the first aspect, then the resistivity will drop in localized locations where the Li compounds 21 are present, while the resistivity will be retained at high levels in the majority of locations where they are not present, the result of which is that drop in the resistivity of the piezoelectric ceramic layers 2 as a whole can be restrained.

Preferably the locations to which the aforementioned Li compounds 21 are localized exist at the topmost surface of the multilayer piezoelectric ceramic 100 in the laminating direction, and/or in the internal electrode layers 3 and/or in their vicinities. The impact of their localization on the drop in resistivity is low in these locations that are either inherently conductive or will form a surface electrode and thus be given conductivity when it is applied to a multilayer piezoelectric element 110.

Here, the following method is used to determine that Li compounds 21 other than the aforementioned primary component are localized within the multilayer piezoelectric ceramic 100. First, the multilayer piezoelectric ceramic 100 is cut along a plane parallel to the laminating direction. Next, line analysis is performed on the cut face from the center part in the laminating direction toward the end parts in the laminating direction, based on laser ablation inductively coupled plasma mass spectrometry (LA-ICP-MS), to measure the distributions of Nb and Li. Next, from the obtained measurement results, the ratio of the Li concentration to the Nb concentration as expressed in percent by atom ($C_{Li}/C_{Nb}$) is calculated. Then, if the percentage, to all measurement points, of the measurement points at which the value of this ratio ($C_{Li}/C_{Nb}$) is 0.2 or greater is higher than 0 percent and 5 percent or lower, the multilayer piezoelectric ceramic 100 that has been measured is determined to have localized Li compounds 21 other than the aforementioned primary component. This determination method is based on the assumption that, if Li compounds 21 other than the aforementioned primary component are evenly distributed, then there should be many locations where $Li_3NbO_4$ and other compounds for which the ratio ($C_{Li}/C_{Nb}$) is 0.2 or greater are present, and consequently the ratio should become 2 or greater at many measurement points.

For a multilayer piezoelectric ceramic which has been determined to have localized Li compounds other than the primary component of the ceramic, the location of the localized Li compounds can be determined as follows. That is, the following method is used to determine that the Li compounds 21 are localized at the topmost surface of the multilayer piezoelectric ceramic 100 in the laminating direction, and/or in the internal electrode layers 3 and/or in their vicinities. First, the distribution of Ag signal strengths is measured, in addition to the distributions of Nb and Li concentrations, by the aforementioned LA-ICP-MS line analysis. Next, measurement points at which the signal strength corresponds to a count of 50,000 or higher are determined as the internal electrode layers 3. Next, the thicknesses of the respective internal electrode layers 3 are calculated from the distances between the measurement points that have been determined as internal electrode layers 3, while at the same time the average thickness ($t_{ave}$) is calculated as the average value of the thicknesses. Then, areas within the distance of the aforementioned average thickness ($t_{ave}$) away from the areas that have been determined as internal electrode layers 3, are determined as vicinities of the internal electrode layers 3. Also, areas within the distance of three times the aforementioned average thickness ($t_{ave}$) away from the end part of the multilayer piezoelectric ceramic 100 in the laminating direction, are determined as the topmost surface in the laminating direction. Next, from the Nb and Li distributions obtained by the line analysis, the ratio of the Li concentration to the Nb concentration as expressed in percent by atom ($C_{Li}/C_{Nb}$) is calculated at each measurement point. Then, if the percentage, to all measurement points at which the value of this ratio ($C_{Li}/C_{Nb}$) is 0.2 or greater, of those positioned in the areas that have been determined as the internal electrode layers 3, vicinities of the internal electrode layers 3, or the topmost surface of the multilayer piezoelectric ceramic 100 in the laminating direction, is 80 percent or higher, or if the percentage, to the measurement points at which the value of this ratio ($C_{Li}/C_{Nb}$) is greater than 0, of those positioned in the areas that have been determined as the internal electrode layers 3, vicinities of the internal electrode layers 3, or the topmost surface of the multilayer piezoelectric ceramic 100 in the laminating direction, is 0.15 percent or higher, then the multilayer piezoelectric ceramic 100 that has been measured is determined to have Li components 21 other than the aforementioned primary component localized at the topmost surface of the multilayer piezoelectric ceramic 100 in the laminating direction, and/or in the internal electrode layers 3 and/or in their vicinities.

Figure 2:
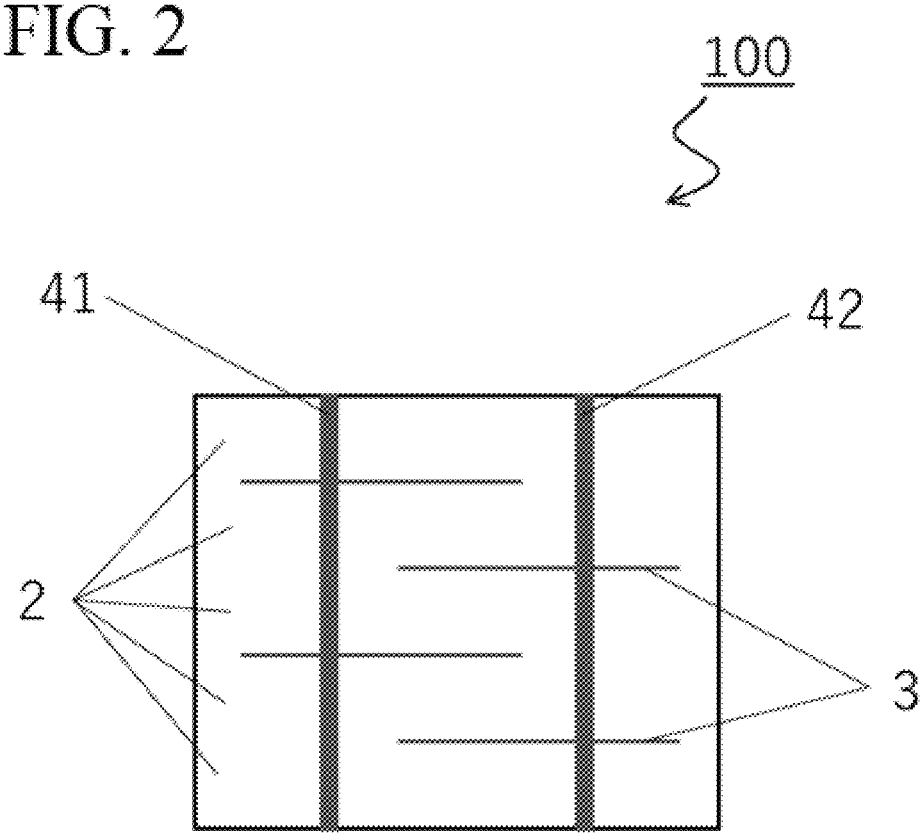
FIG. 2 is a schematic cross-section view showing the structure of a multilayer piezoelectric ceramic having connection conductors running through the piezoelectric ceramic layers

In the first aspect, the multilayer piezoelectric ceramic, when it is applied to a piezoelectric element, may be such that connection conductors 41, 42 that would electrically connect together those internal electrode layers 3, 3 to which voltage of the same polarity (positive or negative) or phase will be applied, are provided in a manner running through the piezoelectric ceramic layers 2, as shown schematically in FIG. 2. The connection conductors 41, 42 that run through the piezoelectric ceramic layers 2 are placed so that they each connect the alternate internal electrode layers 3,3, as shown in FIG. 2. It should be noted that FIG. 2 does not show the Li compounds 21 other than the primary component, that are localized within the multilayer piezoelectric ceramic 100.

[Method for Manufacturing Multilayer Piezoelectric Ceramic]

The method for manufacturing multilayer piezoelectric ceramic pertaining to the second aspect of the present invention (hereinafter also referred to simply as "second aspect") includes: preparing green sheets containing: a material powder that: has a perovskite compound expressed by the composition formula $Li_xNa_yK_{1-x-y}NbO_3$ (where $0.02<x\leq0.1$, $0.02<x+y\leq1$) as the primary component; contains 0.2 to 3.0 mol of Li relative to 100 mol of the primary component; and does not contain lead as a constituent element; and a binder; preparing a conductive paste containing a metal powder whose silver content is 80 percent by mass or higher; forming conductor layers on the green sheets using the conductive paste; stacking the green sheets on which the conductor layers have been formed and then bonding the green sheets together to obtain a formed green sheet; and removing the binder from the formed green sheet, and then sintering it for 5 hours or longer at a temperature of 850° C. or above to obtain a sintered body.

The green sheets used in the second aspect contain: a material powder that has a perovskite compound expressed by the composition formula $Li_xNa_yK_{1-x-y}NbO_3$ (where $0.02<x\leq0.1$, $0.02<x+y\leq1$) as the primary component and contains 0.2 to 3.0 mol of Li relative to 100 mol of the primary component; and a binder.

The primary component of the material powder contained in the green sheets is obtained by mixing prescribed quantities of lithium compound powder, sodium compound powder, potassium compound powder, and niobium compound powder, and then calcining (tentatively sintered) the mixture.

The lithium compound, sodium compound, potassium compound, and niobium compound to be used are not limited in composition, purity, grain size, etc., so long as they are powders that will react with one another when calcined and produce a perovskite compound expressed by the aforementioned composition formula. They may be compounds that contain two or more types of elements among Li, Na, K, and Nb, or compounds that contain other elements acting as additive elements. Examples of lithium compounds that can be used include lithium carbonate ($Li_2CO_3$), etc. Also, examples of sodium compounds that can be used include sodium carbonate ($Na_2CO_3$), sodium hydrogen carbonate ($NaHCO_3$), etc., Also, examples of potassium compounds that can be used include potassium carbonate ($K_2CO_3$), potassium hydrogen carbonate ($KHCO_3$), etc. Also, examples of niobium compounds that can be used include niobium pentoxide ($Nb_2O_5$), etc.

The method for mixing these compound powders is not limited in any way so long as the respective powders are mixed uniformly while mixing-in of impurities is prevented, and either dry mixing or wet mixing may be adopted. If wet mixing using a ball mill is adopted as the mixing method, the mixing should be performed for approx. 8 to 24 hours, for example.

The calcining conditions are not limited so long as the respective compounds will react with one another and a calcined powder will be obtained whose primary component is a perovskite compound expressed by the aforementioned composition formula, and should be 2 to 8 hours at 700 to 1000° C. in the air, for example. If the calcining temperature is too low or the calcining period is too short, there are concerns that unreacted materials or intermediate products may remain. If the calcining temperature is too high or the calcining period is too long, on the other hand, there are concerns that the alkali components will volatilize and a compound of the desired composition may not be obtained, or generated substances will agglomerate and become harder to disintegrate, thus causing the productivity to drop.

In the second aspect, the operation of mixing the lithium compound into the primary component of the material powder may also serve to disintegrate the calcined powder. If wet mixing using a ball mill is adopted as the mixing method, the mixing should be performed for approx. 8 to 24 hours. Furthermore, these compounds may be added and mixed to/with the material powder together with the binder when the below-mentioned forming composition is obtained.

In the second aspect, the binder contained in the green sheets is not limited in type so long as it can form the material powder into a desired shape and retain the shape and will also volatilize, as a result of the below-mentioned sintering or the preceding binder removal process, without causing carbon, etc., to remain. Examples of binders that can be used include those based on polyvinyl alcohols, polyvinyl butyrals, celluloses, urethanes, vinyl acetates, and the like.

The binder is not limited in use quantity in any way, either, but since it will be removed in a subsequent step, preferably the use quantity is minimized to the extent that the desired formability and shape retainability can be obtained, from the viewpoint of reducing material costs.

The green sheets used in the second aspect are manufactured by forming into sheet shape the forming composition obtained by mixing the material powder and binder.

Various types of additives may be mixed into the forming composition besides the forming powder and binder, such as a plasticizer for improving the formability and, if the forming composition is in slurry state, a dispersant for uniformly dispersing the forming powder.

For the sheet forming method, the doctor blade method, extrusion method, or any other commonly used method may be adopted.

It should be noted that, when manufacturing a multilayer piezoelectric ceramic having connection conductors running through the piezoelectric ceramic layers as described above, the obtained green sheets are punched, irradiated with a laser beam, or otherwise processed to have penetration holes (also referred to as through holes and vias) formed in them, to be filled with the connection conductors.

The conductive paste used in the second aspect contains a metal powder whose silver content is 80 percent by mass or higher.

The metal powder with a silver content of 80 percent by mass or higher which is contained in the conductive paste may be an Ag—Pd alloy powder, a mixed powder of Ag and Pd powders, a pure silver powder, or the like.

The conductive paste used in the second aspect normally contains, in addition to the aforementioned metal powder, an organic vehicle comprising a binder dissolved in an organic solvent.

The binder used in the organic vehicle is not limited in any way, and may be selected as deemed appropriate from among the various commonly used binders such as ethyl celluloses, polyvinyl butyrals, and acrylics.

Also, the organic solvent used in the organic vehicle is not limited in any way so long as it causes minimal swelling of the aforementioned green sheets when conductor layers are formed on the green sheets using the conductive paste, and may be selected as deemed appropriate from among terpineol, butyl carbitol, acetone, toluene, MEK (methyl ethyl ketones), etc.

The content of the organic vehicle in the conductive paste is not limited in any way and, for example, the binder may be contained by approx. 5 to 10 percent by mass and the organic solvent, by approx. 10 to 50 percent by mass.

Also, the conductive paste may contain, as necessary, various dispersants and plasticizers as well as glass frit, etc., for improving the adhesive strength to the piezoelectric ceramic layers after sintering.

When preparing the conductive paste, a method of kneading a mixture of the aforementioned components using a triple-roll mill, mortar machine, planetary ball mill, etc., may be adopted.

In the second aspect, conductor layers are formed on the green sheets described above using the aforementioned conductive paste.

For the forming of conductor layers, any commonly used method may be adopted. For example, a method of printing or applying the conductive paste is preferred in terms of cost.

It should be noted that, when manufacturing a multilayer piezoelectric ceramic having connection conductors running through the piezoelectric ceramic layers as described above, an electrode material that will become connection conductors after sintering is filled, either before or after the forming of conductor layers, in the penetration holes that have been formed in the green sheets. Although the filling method is not limited in any way, a method of printing a paste that contains an electrode material is preferred in terms of cost.

In the second aspect, the green sheets on which the conductor layers have been formed are stacked, and then the green sheets are bonded together, to obtain a formed green sheet.

The stacking and bonding may be performed using any commonly used methods. For example, a method of thermally compressing the green sheets together using the function of the binder is preferred in terms of cost.

In the second aspect, the binder is removed from the formed green sheet, which is then sintered for 5 hours or longer at a temperature of 850° C. or above, to obtain a sintered body.

The binder removal and the sintering may be continuously performed using the same sintering device. The binder removal and sintering conditions may be set as deemed appropriate by considering the volatilization temperature and content of the binder, as well as the sintering property of the piezoelectric ceramic composition, durability of the internal electrode material, and the like.

The sintering is performed for 5 hours or longer at a temperature of 850° C. or above. This way, the produced conductive Li compounds will agglomerate sufficiently and a sintered body with high insulating property will be obtained. The conventional practice, when a formed green sheet having silver-containing conductor layers is sintered, has been to shorten the sintering period as much as possible to the extent that a dense sintered body can still be obtained, in order to prevent thickness reduction in the conductor layers or internal electrode layers due to diffusion of silver, or drop in the properties of the multilayer piezoelectric ceramic to be obtained. Contrary to the conventional practice, however, the second aspect extends the sintering period to achieve the aforementioned functions, which is significant.

Preferably the aforementioned sintering temperature is set to 900° C. or above. The sintering temperature should be limited on the upper end to a temperature at which the metal constituting the internal electrode layers does not melt and flow out; for example, it should be set to 1100° C. or below. Also, the aforementioned sintering period should be set preferably to 8 hours or longer, or more preferably to 10 hours or longer, from the viewpoint of enhancing the agglomeration effect on the Li compounds. On the other hand, the aforementioned sintering period should be set preferably to 20 hours or shorter, or more preferably to 15 hours or shorter, from the viewpoint of completing the process quickly and thereby increasing the manufacturing efficiency.

The sintering in the second aspect may be performed by changing the temperature midway. In this case, the sintering period refers to the period during which the temperature remains at or above what is defined as the lower limit of sintering temperature. One example is to raise the temperature from 850° C. to 1000° C. over 3 hours and then hold 1000° C. for 2 hours, in which case the sintering period at 850° C. or above is 5 hours.

The sintering atmosphere in the second aspect is not limited in any way, but preferably it is the air because no special sintering device is required.

It should be noted that, while the explanations so far discussed a case of removing the binder from and sintering the formed green sheet directly, the formed green sheet may be divided into several blocks prior to sintering if multiple multilayer piezoelectric ceramics are to be obtained from one formed green sheet.

[Multilayer Piezoelectric Element]

The multilayer piezoelectric ceramic pertaining to the first aspect, or the multilayer piezoelectric ceramic obtained by the second aspect, will become the multilayer piezoelectric element pertaining to the third aspect (hereinafter also referred to simply as "third aspect") when electrodes are formed on its surface and polarized. The third aspect is explained below by referring to FIGS. 3A and 3B. It should be noted that FIGS. 3A and 3B do not show the Li compounds other than the primary component that are localized within the multilayer piezoelectric ceramic.

Figure 3A:
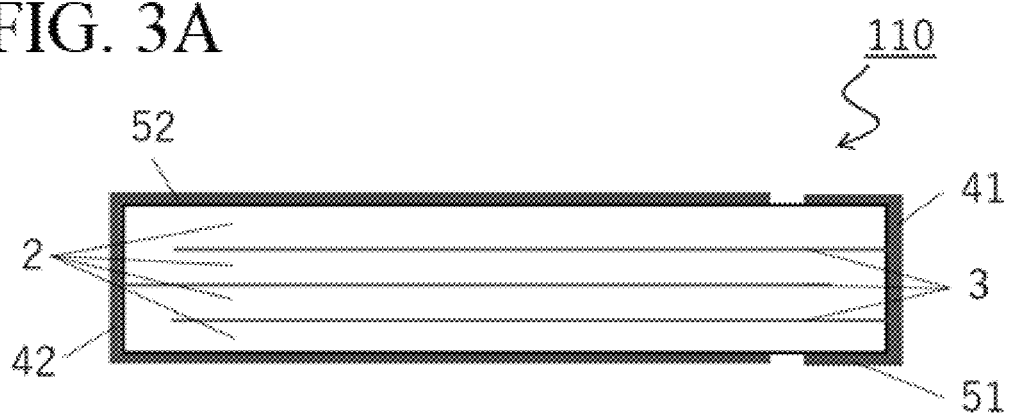
FIGS. 3A and 3B are schematic views showing the structure of a multilayer piezoelectric element (FIG. 3A is a front view, while FIG. 3B is a perspective view)
Figure 3B:
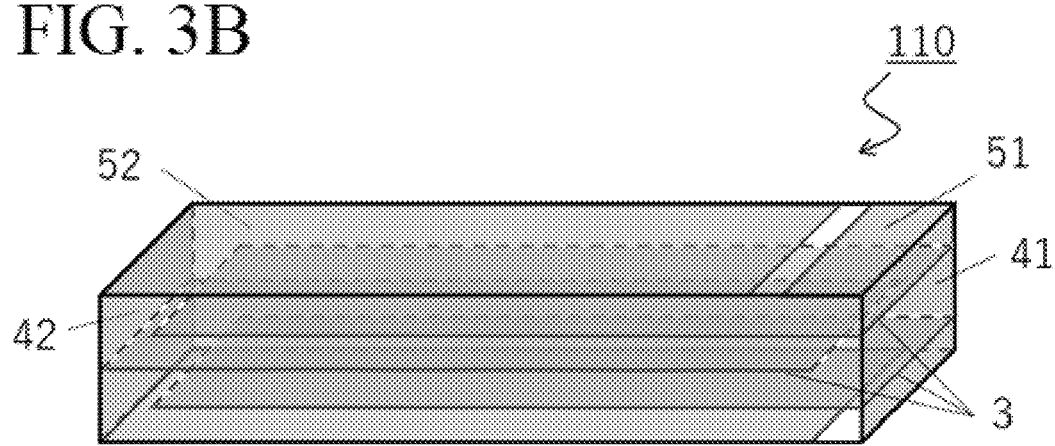

The multilayer piezoelectric element 110 pertaining to the third aspect is constituted by the multilayer piezoelectric ceramic 100 and surface electrodes 51, 52 formed on its surface. If the multilayer piezoelectric ceramic 100 does not have connection conductors 41, 42 running through the piezoelectric ceramic layers 2 for electrically connecting the internal electrode layers 3, 3 together, the multilayer piezoelectric element 110 is structured in such a way that the connection conductors 41, 42 are also provided on the surface, as shown in FIGS. 3A and 3B. The connection conductors 41, 42 are each connected to the alternate internal electrode layers 3. To be specific, the connection conductor 41 is electrically connected to the odd-numbered internal electrode layers 3 as counted from the top, while the connection conductor 42 is electrically connected to the even-numbered internal electrode layers 3 as counted from the top. It should be noted that these electrical connections may be done by swapping the odd-numbered positions and the even-numbered positions. The surface electrodes 51, 52 are electrically connected to either one of the connection conductors 41, 42, respectively, and function, together with the internal electrode layers 3 connected thereto, to apply voltage to the piezoelectric ceramic layers 2. It should be noted that, if the aforementioned connection conductors 41, 42 are provided on the surface of the multilayer piezoelectric element 110, the connection conductors 41, 42 may be constituted so that they also serve as the surface electrodes 51, 52.

For the forming of the surface electrodes 51, 52 and connection conductors 41, 42, any commonly used method, such as a method of applying or printing a paste containing an electrode material on the surface of the multilayer piezoelectric ceramic 100 and then baking the paste, or a method of vapor-depositing an electrode material on the surface of the multilayer piezoelectric ceramic 100, may be adopted. The electrode material is not limited in any way so long as it is highly conductive and also physically and chemically stable in the use environment of the piezoelectric element. Examples of electrode materials that can be used include silver (Ag), copper (Cu), gold (Au), platinum (Pt), palladium (Pd), nickel (Ni), alloys thereof, and the like. The electrode material with which to constitute the surface electrodes 51, 52 and connection conductors 41, 42 may be the same as, or different from, the electrode material with which to constitute the internal electrode layers 3.

The polarization conditions are not limited in any way so long as the orientations of spontaneous polarizations in the piezoelectric ceramic layers 2 can be aligned without causing cracks or other damage to the multilayer piezoelectric ceramic 100. As an example, an electric field of 1 to 5 kV/mm may be applied at a temperature of 50 to 200° C.

[Piezoelectric Vibration Device]

The piezoelectric element pertaining to the third aspect is used favorably in a piezoelectric vibration device. Accordingly, a vibration device using the piezoelectric element is explained as a fourth aspect of the present invention.

The vibration device pertaining to the fourth aspect operates by applying electrical signals to and thereby vibrating the piezoelectric element, and causing a vibration plate to vibrate as a result.

The material for the vibration plate to be used is not limited in any way so long as it will vibrate as a result of the piezoelectric element vibrating, and, for example, polycarbonate, acrylic, or other resin, SUS, brass, or other metal, or glass, and the like may be used. Also, the dimensions and shape of the vibration plate are not limited in any way, either, and, for example, a rectangular plate, polygonal plate, circular plate, or oval plate, and the like, of 10 to 500 μm in thickness may be utilized.

The means for joining the piezoelectric element to the vibration plate is not limited in any way so long as the vibration of the piezoelectric element can be transmitted efficiently to the vibration plate, and an adhesive using an epoxy resin, etc., or double-sided tape, and the like may be utilized.

EXAMPLES

The present invention is explained more specifically below using examples; it should be noted, however, that the present invention is not limited to these examples.

Comparative Example 1

[Manufacturing of Green Sheets]

As starting materials, high-purity lithium carbonate ($Li_2CO_3$), sodium carbonate ($Na_2CO_3$), potassium carbonate ($K_2CO_3$), and niobium pentoxide ($Nb_2O_5$) in powdered state were used.

These starting materials were weighed so that the calcined powder to be obtained would have a composition formula of $Li_{0.06}Na_{0.52}K_{0.42}NbO_3$, and then wet-mixed in a ball mill.

The mixed slurry was dried, and the resulting mixed powder was calcined under the conditions of 3 hours at 900° C. in the air, to obtain a calcined powder.

To the obtained calcined powder, high-purity lithium carbonate ($Li_2CO_3$), barium carbonate ($BaCO_3$), manganese carbonate ($MnCO_3$), and silicon dioxide ($SiO_2$) were added by quantities that would give 1.3 mol of Li, 0.5 mol of Ba, 0.5 mol of Mn, and 1.3 mol of Si, relative to 100 mol of $Li_{0.06}Na_{0.52}K_{0.42}NbO_3$, to obtain a material powder.

A polyvinyl butyral binder was mixed into the obtained material powder, to obtain a forming composition.

Using the doctor blade method, the obtained forming composition was formed into green sheets of 20 μm in thickness.

[Manufacturing of Multilayer Piezoelectric Ceramic]

An Ag—Pd alloy paste (Ag/Pd ratio=9/1) was screen-printed on the obtained green sheets to form conductor layers of prescribed shapes, after which the green sheets were stacked and pressure-bonded together under heating, to obtain a formed green sheet.

The obtained formed green sheet underwent the binder removal process in the air, and was then sintered in the air in such a way that its temperature was raised to 1000° C. and held for 1 minute, followed by furnace cooling, to obtain the multilayer piezoelectric ceramic pertaining to Comparative Example 1. It should be noted that this multilayer piezoelectric ceramic had a structure wherein the internal electrode layers were exposed alternately on a pair of opposing end faces parallel to the laminating direction.

[Determination of Presence/Absence of Localized Li Compounds in Multilayer Piezoelectric Ceramic]

Figures 4A, 4B, 4C:
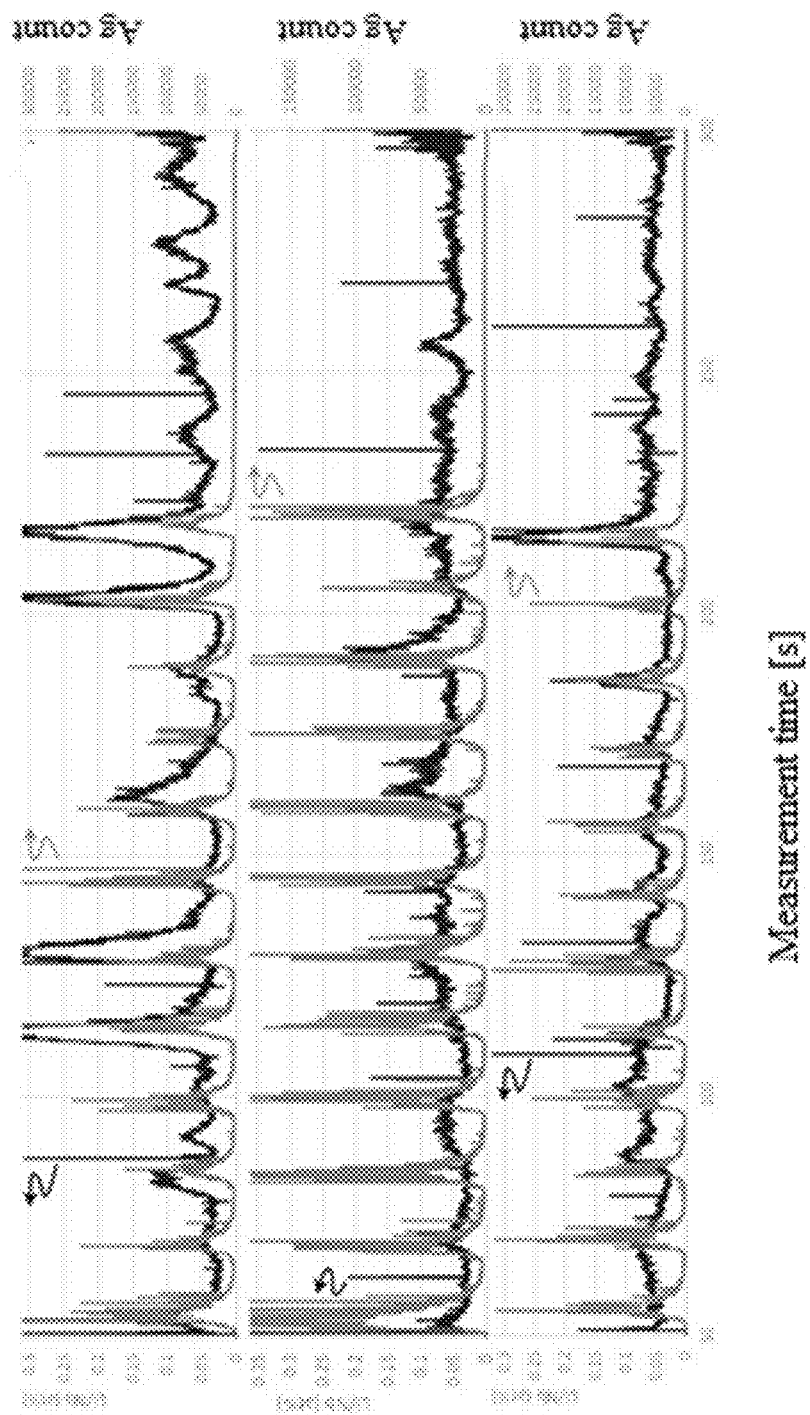
FIGS. 4A to 4C are line analysis results of cross-sections of multilayer piezoelectric ceramics based on laser ablation inductively coupled plasma mass spectrometry (LA-ICP-MS) (FIG. 4A represents Comparative Example 1, FIG. 4B represents Example 1, and FIG. 4C represents Example 3)

With regard to the obtained multilayer piezoelectric ceramic, the aforementioned method was used to determine presence/absence of localized Li compounds other than the primary component. The distributions of $C_{Li}/C_{Nb}$ values and Ag signal strengths, based on LA-ICP-MS measurement of a cross-section of the multilayer piezoelectric ceramic, are both shown in FIG. 4A. In the graph, the black line represents the value of $C_{Li}/C_{Nb}$, while the gray line represents the signal strength of Ag. In this graph, measurement points at which the value of $C_{Li}/C_{Nb}$ is greater than 0 are seen ubiquitously. At the measurement points spanning from the first internal electrode layer to the topmost surface in the laminating direction, the existence of a considerable number of peaks with a $C_{Li}/C_{Nb}$ of 0.1 or higher was confirmed (wherein each and every measurement point with a $C_{Li}/C_{Nb}$ of 0.1 or higher was counted).

Example 1

The multilayer piezoelectric ceramic pertaining to Example 1 was obtained in the same manner as in Comparative Example 1, except that the holding period at 1000° C. during sintering was changed to 5 hours.

With regard to the obtained multilayer piezoelectric ceramic, presence/absence of localized Li compounds other than the primary component was determined according to the same method in Comparative Example 1. The distributions of $C_{Li}/C_{Nb}$ values and Ag signal strengths, based on LA-ICP-MS measurement of a cross-section of the multilayer piezoelectric ceramic, are both shown in FIG. 4B. In the graph, the black line represents the value of $C_{Li}/C_{Nb}$, while the gray line represents the signal strength of Ag. In this graph, measurement points at which the value of $C_{Li}/C_{Nb}$ is greater than 0 are seen abundantly at the topmost surface of the multilayer piezoelectric ceramic in the laminating direction, in the internal electrode layers, and in the vicinities thereof. At the measurement points spanning from the first internal electrode layer to the topmost surface in the laminating direction, the number of peaks with a $C_{Li}/C_{Nb}$ of 0.1 or higher decreased to four (at a measurement time [sec.] of approximately 234, 254, 256, and 269, excluding measurement points at the far right due to the possibility of contamination), in comparison to Comparative Example 1, indicating sufficient agglomeration of Li compounds other than the primary component. Also, among the measurement points at which the value of $C_{Li}/C_{Nb}$ is greater than 0, those positioned at the topmost surface of the multilayer piezoelectric ceramic in the laminating direction, and/or in the internal electrode layers and/or in their vicinities, accounted for 0.15 percent or higher (this was apparent based on the figure without actual calculation). These results can confirm that, in the multilayer piezoelectric ceramic pertaining to Example 1, Li compounds other than the primary component are localized at the topmost surface of the multilayer piezoelectric ceramic in the laminating direction, and/or in the internal electrode layers and/or in their vicinities.

Example 2

The multilayer piezoelectric ceramic pertaining to Example 2 was obtained in the same manner as in Comparative Example 1, except that the holding period at 1000° C. during sintering was changed to 2 hours.

When, with regard to the obtained multilayer piezoelectric ceramic, presence/absence of localized Li compounds other than the primary component was determined according to the same method in Comparative Example 1, results similar to those in Example 1 were obtained. These results can confirm that, in the multilayer piezoelectric ceramic pertaining to Example 2, Li compounds other than the primary component are localized at the topmost surface of the multilayer piezoelectric ceramic in the laminating direction, and/or in the internal electrode layers and/or in their vicinities.

Example 3

The multilayer piezoelectric ceramic pertaining to Example 3 was obtained in the same manner as in Comparative Example 1, except that the holding period at 1000° C. during sintering was changed to 10 hours.

With regard to the obtained multilayer piezoelectric ceramic, presence/absence of localized Li compounds other than the primary component was determined according to the same method in Comparative Example 1. The distributions of $C_{Li}/C_{Nb}$ values and Ag signal strengths, based on LA-ICP-MS measurement of a cross-section of the multilayer piezoelectric ceramic, are both shown in FIG. 4C. In the graph, the black line represents the value of $C_{Li}/C_{Nb}$, while the gray line represents the signal strength of Ag. In this graph, measurement points at which the value of $C_{Li}/C_{Nb}$ is greater than 0 are seen abundantly at the topmost surface of the multilayer piezoelectric ceramic in the laminating direction, in the internal electrode layers, and in the vicinities thereof. At the measurement points spanning from the first internal electrode layer to the topmost surface in the laminating direction, the number of peaks with a $C_{Li}/C_{Nb}$ of 0.1 or higher decreased to four (at a measurement point [sec.] of approximately 241, 244, 260, and 283, excluding measurement points at the far right due to the possibility of contamination), in comparison to Comparative Example 1, indicating sufficient agglomeration of Li compounds other than the primary component. Also, among the measurement points at which the value of $C_{Li}/C_{Nb}$ is greater than 0, those positioned at the topmost surface of the multilayer piezoelectric ceramic in the laminating direction, and/or in the internal electrode layers and/or in their vicinities, accounted for 0.15 percent or higher (this was apparent based on the figure without actual calculation). From these results, it can be argued that, in the multilayer piezoelectric ceramic pertaining to Example 3, Li compounds other than the primary component are localized at the topmost surface of the multilayer piezoelectric ceramic in the laminating direction, and/or in the internal electrode layers or in their vicinities.

[Lifespan Measurement of Multilayer Piezoelectric Element]

An Ag paste was applied on the end faces on which the internal electrodes are exposed, and topmost surfaces in the laminating direction, of the multilayer piezoelectric ceramics pertaining to Comparative Example 1 and Examples 1 and 2, after which the ceramics were passed through a belt furnace to bake the paste, thereby forming connection conductors and surface electrodes, respectively.

The multilayer piezoelectric ceramics on which the electrodes had been formed were polarized for 15 minutes in silicone oil at 150° C. under an electric field strength of 3 kV/mm, to obtain multilayer piezoelectric elements.

To each of the obtained multilayer piezoelectric elements, 3 kV/mm of voltage was applied in a 65° C. environment and the time it took for the current value to exceed 300 μA was measured and used as the element lifespan.

Figure 5:
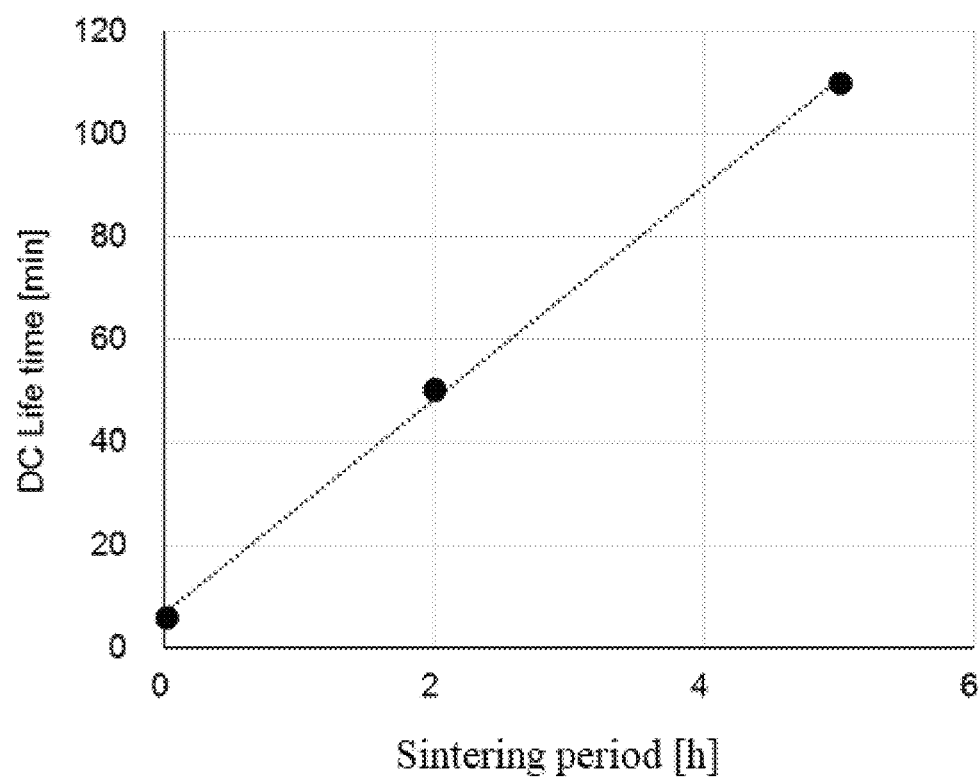
FIG. 5 is a graph showing the relationship between element lifespan and sintering period with respect to a multilayer piezoelectric element

The relationship between the obtained element lifespan, and the sintering period, is shown in FIG. 5. From FIG. 5, it can be argued that, to the extent studied using the comparative example and examples, the longer the sintering period, the longer the lifespan of the multilayer piezoelectric element becomes.

Based on the above, it can be argued that, when manufacturing an alkali niobate-based multilayer piezoelectric ceramic with a high content percentage of silver in its internal electrode layers, performing sintering for a long period of time will yield a multilayer piezoelectric ceramic in which Li compounds other than alkali niobate, being the primary component, are localized. Since many of these Li compounds, such as $Li_3NbO_4$, are conductive, it can be interpreted that localization of the Li compounds inhibited drop in the insulating property of the piezoelectric ceramic layers and thereby yielded a multilayer piezoelectric element with a long lifespan.

INDUSTRIAL APPLICABILITY

According to the present invention, a multilayer piezoelectric element having excellent insulating property and a long lifespan, whose piezoelectric ceramic layers do not contain lead as a constituent element, and whose internal electrode layers have a high content percentage of silver, can be provided. The present invention is useful in that increasing the content percentage of silver in the internal electrode layers of the multilayer piezoelectric element can reduce the use quantities of palladium and other expensive metals, which in turn allows for reduction in the material cost of the element. Also, the present invention is preferable in that, since the internal electrode layers with a high content percentage of silver have low resistivity and excellent conductivity, generation of resistance heat can be suppressed when the multilayer piezoelectric element is used (driven), making it a high-performance element. Conceivably the excellent insulating property and long element lifespan of the multilayer piezoelectric element pertaining to the present invention are attributable to the localization, not uniform distribution, of conductive Li compounds, which can help maintain the electrical resistance of the entire element at high levels.

We claim:

1. A multilayer piezoelectric element comprising:
a multilayer piezoelectric ceramic constituted by piezoelectric ceramic layers stacked alternately with internal electrode layers, wherein the multilayer piezoelectric ceramic has two end faces opposed to each other, two side faces opposed to each other, and a top face and a bottom face opposed to each other, wherein each of the internal electrode layers is exposed to either one of the two end faces in an alternate manner in a stacking direction;
first and second connection conductors electrically connected to the internal electrode layers at the two end faces, respectively;
first and third surface electrodes extending on the top face and the bottom face of the multilayer piezoelectric ceramic, respectively, from the first connection conductor, and electrically connected to the first connection conductor; and
second and fourth surface electrodes extending on the top face and the bottom face of the multilayer piezoelectric ceramic, respectively, from the second connection conductor, and electrically connected to the second connection conductor;
wherein the first and third surface electrodes are longer than the second and fourth surface electrode, respectively, in a direction in which the end faces face each other,
wherein internal electrode layers closest to the first and third surface electrodes in the stacking direction, respectively, among all the internal electrode layers, are electrically connected to the first connection conductor,
wherein internal electrode layers closest to the second and fourth surface electrodes in the stacking direction, respectively, among all the internal electrode layers, are electrically connected to the second connection conductor, and
wherein the multilayer piezoelectric ceramic is constituted by piezoelectric ceramic layers stacked alternately with internal electrode layers, wherein the piezoelectric ceramic layers:
do not contain lead as a constituent element;
have a perovskite compound expressed by a composition formula $Li_xNa_yK_yK_{1-x-y}NbO_3$ (where $0.02<x\leq0.1$, $0.02<x+y\leq1$) as a primary component; and
contain 0.2 to 3.0 mol of Li relative to 100 mol of the primary component;
wherein the internal electrode layers are constituted by a metal that contains silver by 80 percent by mass or more; and
Li compounds other than the primary component are localized in a given portion within the multilayer piezoelectric ceramic.

2. A piezoelectric vibration device comprising the multilayer piezoelectric element of claim 1, and a vibration plate joined to the piezoelectric element.

3. The multilayer piezoelectric element according to claim 1, wherein, in the multilayer piezoelectric ceramic, the Li compounds are localized in a manner that, when a ratio of Li atomic concentration to Nb atomic concentration, or $C_{Li}/C_{Nb}$, is measured on a cut face obtained by cutting the multilayer piezoelectric ceramic along a plane parallel to a laminating direction, measurement points where $C_{Li}/C_{Nb}\geq 0.2$ is satisfied account for 5 percent of all measurement points or less.

4. The multilayer piezoelectric element according to claim 1, wherein, in the multilayer piezoelectric ceramic, the Li compounds are localized at a topmost surface of the multilayer piezoelectric ceramic in a laminating direction, and/or in the internal electrode layers and/or in their vicinities.

5. The multilayer piezoelectric element according to claim 3, wherein the Li compounds are localized in a manner that, when a ratio of Li atomic concentration to Nb atomic concentration, or $C_{Li}/C_{Nb}$, is measured on a cut face obtained by cutting the multilayer piezoelectric ceramic along a plane parallel to a laminating direction, a percentage, to measurement points where $C_{Li}/C_{Nb}\geq 0.2$ is satisfied, of those positioned in areas within a distance of $t_{avg}$—representing an average thickness of each internal electrode—away from the internal electrode, is 80 percent or higher.

6. The multilayer piezoelectric element according to claim 4, wherein the Li compounds are localized in a manner that, when a ratio of Li atomic concentration to Nb atomic concentration, or $C_{Li}/C_{Nb}$, is measured on a cut face obtained by cutting the multilayer piezoelectric ceramic along a plane parallel to a laminating direction, a percentage, to measurement points where $C_{Li}/C_{Nb}\geq 0.2$ is satisfied, of those positioned in areas within a distance of three times the average thickness $t_{avg}$—representing an average thickness of each internal electrode— away from the topmost surface in the laminating direction, is 80 percent or higher.

7. The multilayer piezoelectric element according to claim 4, wherein the Li compounds are localized in a manner that, when a ratio of Li atomic concentration to Nb atomic concentration, or $C_{Li}/C_{Nb}$, is measured on a cut face obtained by cutting the multilayer piezoelectric ceramic along a plane parallel to a laminating direction, a percentage, to measurement points where $C_{Li}/C_{Nb}>0$ is satisfied, of those positioned in areas within a distance of $t_{avg}$—representing an average thickness of each internal electrode— away from the internal electrode, is 0.15 percent or higher.

8. The multilayer piezoelectric element according to claim 4, wherein the Li compounds are localized in a manner that, when a ratio of Li atomic concentration to Nb atomic concentration, or $C_{Li}/C_{Nb}$, is measured on a cut face obtained by cutting the multilayer piezoelectric ceramic along a plane parallel to a laminating direction, a percentage, to measurement points where $C_{Li}/C_{Nb}>0$ is satisfied, of those positioned in areas within the distance of three times the average thickness $t_{avg}$—representing an average thickness of each internal electrode— away from the topmost surface in the laminating direction, is 0.15 percent or higher.

9. The multilayer piezoelectric element according to claim 1, wherein, in the multilayer piezoelectric ceramic, the piezoelectric ceramic layers contain, relative to 100 mol of the primary component:
   2 to 5.0 mol of at least one alkali earth metal element selected from a group consisting of Ca, Sr, and Ba;
   2 to 2.0 mol of Mn; and
   0.1 to 3.0 mol of Si.

\* \* \* \* \*

UNITED STATES PATENT AND TRADEMARK OFFICE
CERTIFICATE OF CORRECTION

PATENT NO. : 11,631,801 B2
APPLICATION NO. : 16/833251
DATED : April 18, 2023
INVENTOR(S) : Tomohiro Harada et al.

Page 1 of 1

It is certified that error appears in the above-identified patent and that said Letters Patent is hereby corrected as shown below:

In the Claims

Column 18, Line 7, in Claim 1, "K.sub.y" in the formula "Li.sub.xNa.sub.yK.sub.yK.sub.1-x-yNbO.sub.3" should be deleted so as to read --Li.sub.xNa.sub.yK.sub.1-x-yNbO.sub.3--.

Column 18, Line 36, in Claim 5, "claim 3" should be --claim 4--.

Column 19, Line 14, in Claim 9, "2" in the range "2 to 5.0" should be --0.2--.

Column 19, Line 16, in Claim 9, "2" in the range "2 to 5.0" should be --0.2--.

Signed and Sealed this
Fifth Day of December, 2023

Katherine Kelly Vidal
*Director of the United States Patent and Trademark Office*